(12) United States Patent
Bakker et al.

(10) Patent No.: US 7,592,610 B2
(45) Date of Patent: Sep. 22, 2009

(54) MIRROR FOR USE IN A LITHOGRAPHIC APPARATUS, LITHOGRAPHIC APPARATUS, DEVICE MANUFACTURING METHOD, AND DEVICE MANUFACTURED THEREBY

(75) Inventors: Levinus Pieter Bakker, Helmond (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 531 days.

(21) Appl. No.: 10/968,471

(22) Filed: Oct. 20, 2004

(65) Prior Publication Data

US 2005/0111080 A1 May 26, 2005

(30) Foreign Application Priority Data

Oct. 20, 2003 (EP) .................................. 03078316

(51) Int. Cl.
*G21K 1/06* (2006.01)
*G02B 1/10* (2006.01)
*G03F 7/20* (2006.01)

(52) U.S. Cl. ............................. 250/492.2; 250/504 R; 438/153

(58) Field of Classification Search ........................ None
See application file for complete search history.

(56) References Cited

U.S. PATENT DOCUMENTS

| 5,958,605 | A | 9/1999 | Montcalm et al. |
| 6,285,737 | B1 | 9/2001 | Sweatt et al. |
| 6,541,786 | B1 | 4/2003 | Partlo et al. |
| 6,968,850 | B2 * | 11/2005 | Chan et al. ................... 134/1.1 |

FOREIGN PATENT DOCUMENTS

| EP | 1 065 568 A2 | 1/2001 |
| EP | 1 065 568 A3 | 3/2003 |
| EP | 1 333 323 A2 | 8/2003 |
| EP | 1 348 984 A1 | 10/2003 |
| JP | 2001-523007 A | 11/2001 |
| JP | 2003-142296 A | 5/2003 |
| WO | WO 99/63790 A1 | 12/1999 |
| WO | WO 01/37309 A1 | 5/2001 |
| WO | WO 03/087867 A2 | 10/2003 |

(Continued)

OTHER PUBLICATIONS

Silfvast et al., "Laser-produced plasmas for soft x-ray projection lithography", Journal of Vacuum Science and Technology B, vol. 10, No. 6, Nov./Dec. 1992, pp. 3126-3133.*

(Continued)

*Primary Examiner*—Jack I Berman
(74) *Attorney, Agent, or Firm*—Pillsbury Winthrop Shaw Pittman LLP

(57) ABSTRACT

A top layer of a predetermined metal is provided on a mirror for use in a lithographic apparatus having source to provide radiation of a desired wavelength. The source generates a stream of undesired metal particles that are deposited to form smaller and larger nuclei on the mirror. The top layer may interdiffuse in a predetermined temperature range with nuclei of the metal deposition. An additional layer of an alloy of the metal particles and the metal of the top layer is formed that has a higher reflectivity than a layer only comprising the metal particles would have.

30 Claims, 5 Drawing Sheets

FOREIGN PATENT DOCUMENTS

WO   WO 2004/104707 A2   12/2004

OTHER PUBLICATIONS

Partial European Search Report issued in EP 04 07 7836 dated Jan. 13, 2006.

European Search Report issued for European Patent Application No. 05108671.8-2208, dated May 4, 2007.
Austrian Search Report dated Jan. 18, 2008 corresponding to Application No. 200406153-7.
Notice of Reasons for Rejection for Japanese Patent Application No. 2004-304405 dated May 19, 2008.

* cited by examiner

US 7,592,610 B2

MIRROR FOR USE IN A LITHOGRAPHIC APPARATUS, LITHOGRAPHIC APPARATUS, DEVICE MANUFACTURING METHOD, AND DEVICE MANUFACTURED THEREBY

This application claims priority to European Application 03078316.1, filed Oct. 20, 2003, the entire contents of which are incorporated herein by reference.

BACKGROUND OF THE INVENTION

1. Field of the Invention

The present invention relates to a mirror for use in a lithographic apparatus, a lithographic apparatus, a device manufacturing method, and a device manufacture thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction) while synchronously scanning the substrate parallel or anti-parallel to this direction.

Lithographic apparatus may soon employ extreme ultra-violet (EUV) sources, which may use tin or another metal vapor to produce EUV radiation. This tin may leak into the lithographic apparatus, and will be deposited on mirrors in the lithographic apparatus, e.g., the mirrors of the radiation collector. The mirrors of such a radiation collector may be multilayered and may have a ELV reflecting top layer of ruthenium (Ru). Deposited layers of more than approximately 10 nm tin (Sn) on the reflecting Ru layer will reflect EUV radiation in the same way as bulk Sn. A layer of 10 nm Sn may be deposited very quickly near a Sn-based EUV source. The overall transmission of the collector will decrease significantly, since the reflection coefficient of tin is much lower than the reflection coefficient of ruthenium.

SUMMARY OF THE INVENTION

It is an aspect of the present invention to provide a mirror having an overall EUV transmission as high as possible.

According to one embodiment of the present invention, a top layer of a predetermined metal is used on a mirror for use in a lithographic apparatus including a source to provide radiation of a desired wavelength to reduce the formation of a metal deposition on the mirror by a stream of undesired metal particles generated by the source in operation, the predetermined metal being selected such that it interdiffuses in a predetermined temperature range with the metal deposition, when the lithographic apparatus is in operation.

An operative principle of the present invention is the mirror may have a top layer of a metal with a very high reflectivity, e.g., a multi-layer mirror provided with a top layer of Ru. Without a stream of undesired metal particles, a radiation collector provided with such a mirror would have a transmission for EUV of 77%. However, if such a mirror collects such undesired metal particles the reflectivity and transmission is reduced drastically. For example, if the undesired metal particles include Sn and the Sn is deposited as a layer of 10 nm or more, the transmission of such a multi-layer mirror may reduce to 21% for EUV. In accordance with the present invention, the top layer is now selected such that the metal of the top layer interdiffuses with the undesired metal particles when deposited on the top layer. For example, when the undesired metal particles are Sn, the top layer may be made of Au. Then, an Au/Sn alloy film will result on the top layer of Au. The collector transmission of such a mirror may be approximately 0.40, which is significantly higher than the transmission of 0.21 of a mirror with a Sn layer only.

Instead of Au, other elements of group Ib may be used. Pd may be used too.

In a further embodiment, the present invention relates to a use of a top layer of one or more predetermined materials on a mirror for use in a lithographic apparatus including a source to provide radiation of a desired wavelength and that, in operation, generates a stream of undesired metal particles to form a metal deposition on the mirror to extend lifetime of nuclei in a nucleation stage of the metal deposition, which nuclei will be formed when the metal particles are deposited on the top layer when the lithographic apparatus is in operation.

When the one or more predetermined materials are selected to extend the lifetime of nuclei in a nucleation stage of the metal deposition, the thin film growth will be in the nucleation stage as long as possible and a coalescence process will be delayed as much as possible, thereby avoiding a continuous film to be formed on the mirror as long as possible.

In a further embodiment, the invention relates to a mirror for use in a lithographic apparatus including a source to provide radiation of a desired wavelength and that, in operation, generates a stream of undesired metal particles to form a metal deposition on the mirror, the mirror being at least partly covered with a top layer of one or more predetermined materials, the one or more predetermined materials being selected such that it enhances wetting of the metal deposition only on predetermined areas of the top layer.

Here, "wetting" is defined as the tendency of a liquid to spread over a surface. The higher the wetting by the liquid, the lower a contact angle between the liquid and the surface. Here, the metal deposition is in the form of a liquid.

When the one or more predetermined materials enhance wetting of the metal deposition only on predetermined areas of the top layer, the mirror collects undesired metal particles but stimulates nucleation only on those predetermined areas, thereby keeping the mirror outside those predetermined areas as clean as possible. Thereby, the areas outside these predetermined areas can reflect EUV radiation as much as possible.

In a further embodiment, the present invention relates to a mirror for use in a lithographic apparatus including a source to provide radiation of a desired wavelength and that, in operation, generates a stream of undesired metal particles, the mirror being designed to gather and remove the metal particles by capillary action when they are deposited on the mirror when the lithographic apparatus is in operation.

In order to gather and remove the undesired metal particles, the mirror may include trenches and/or holes in the mirror that may be coated with a wetting material. These trenches and holes collect nuclei of the undesired metal particles and guide them away from the reflective mirror surface.

The present invention also relates to a lithographic apparatus that is provided with one or more of the mirrors as described above or that uses a top layer on one or more of the mirrors as described above.

Such a lithographic apparatus may be provided with a heating source to heat the mirror and increase surface mobility of the undesired metal particles on the mirror. Thereby, the deposited undesired metal particles will be evaporated more easily. The evaporation of the undesired metal particles may, moreover, be stimulated by providing a predetermined halogen gas to the surface of the mirror.

In a further embodiment, the present invention relates to a lithographic apparatus including a heating source to heat the mirror and increase surface mobility of the metal particles on the mirror, thereby stimulating evaporation of these metal particles from the mirror.

In an embodiment, such evaporated metal particles may be pumped away by a pump.

Such a lithographic apparatus may include a plurality of mirrors arranged as a radiation collector, a mirror including a rear surface facing a front surface of another mirror, the rear surface of the mirror being arranged to receive metal particles evaporated from the front surface of the other mirror and to operate as a condensation surface. Such a condensation surface may be formed by a separate unit behind the mirror, or may be the rear surface of the mirror itself. The mirror acts as a cooling object for the evaporated metal particles in order to stimulate condensation. A predetermined halogen gas may be used. The lithographic apparatus may be used to manufacture devices, like substrates.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a dvice that can be used to impart a beam or radiation with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components to direct, shape, or control the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
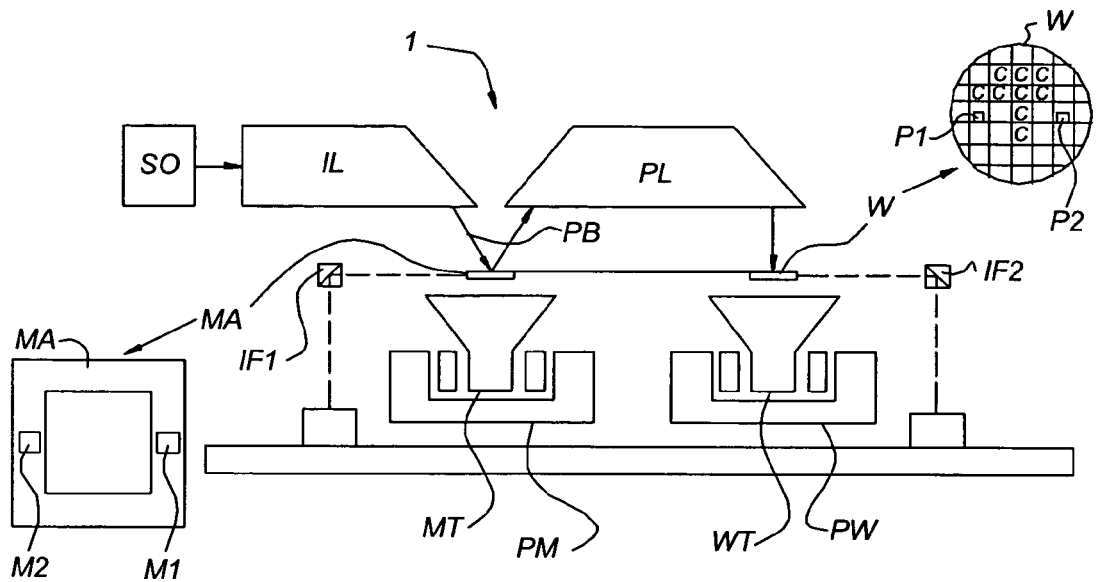
FIG. 1 depicts a lithographic apparatus according to an embodiment of the present invention.

FIG. 1 schematically depicts a lithographic apparatus 1 according to an embodiment of the present invention. The apparatus 1 includes an illumination system (illuminator) IL configured to provide a beam of radiation PB (e.g. UV or EUV radiation). A support (e.g. a mask table) MT is configured to support a patterning device (e.g. a mask) MA and is connected to a first positioning device PM that accurately positions the patterning device with respect to a projection system ("lens") PL. A substrate table (e.g. a wafer table) WT is configured to hold a substrate (e.g. a resist-coated wafer) W and is connected to a second positioning device PW that accurately positions the substrate with respect to the projection system PL. The projection system (e.g. a reflective projection lens) PL images a pattern imparted to the beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases, the source may be integral part of the apparatus, for example when the source is a mercury lamp. The source SO and the illuminator IL may be referred to as a radiation system.

The illuminator IL may include an adjusting device to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width in the non-scanning direction of the target portion in a single dynamic exposure, whereas the length of the scanning motion determines the height in the scanning direction of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
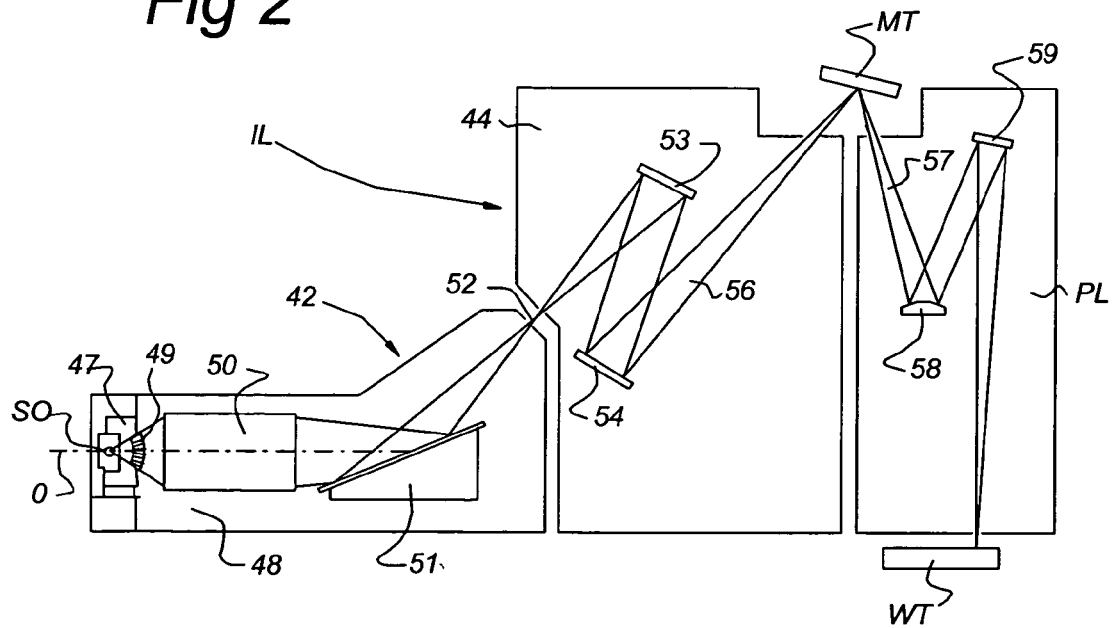
FIG. 2 depicts some parts of FIG. 1 in more detail.

FIG. 2 shows the apparatus 1 in more detail, including a radiation system 42, an illumination optics unit 44, and the projection optics system PL. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing a partially ionized plasma of an electrical discharge to collapse onto an optical axis O. Partial pressures of 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contamination trap 49. The gas barrier 49 includes a channel structure such as, for example, described in detail in U.S. Pat. Nos. 6,614,505 and 6,359,969, which are incorporated herein by reference.

The collector chamber 48 includes a radiation collector 50 which may be formed by a grazing incidence collector. Radiation passed by collector 50 is reflected off a grating spectral filter 51 to be focused in a virtual source point 52 at an aperture in the collector chamber 48. From collector chamber

48, a beam 56 is reflected in the illumination optics unit 44 via normal incidence reflectors 53, 54 onto a reticle or mask positioned on reticle or mask table MT. A patterned beam 57 is formed which is imaged in projection optics system PL via reflective elements 58, 59 onto wafer stage or substrate table WT. More elements than shown may generally be present in illumination optics unit 44 and projection system PL.

Radiation collectors 50 are known from the prior art. One example of a radiation collector that may be used in the present invention is described in European Patent Application 03077675.1.

Figure 3:
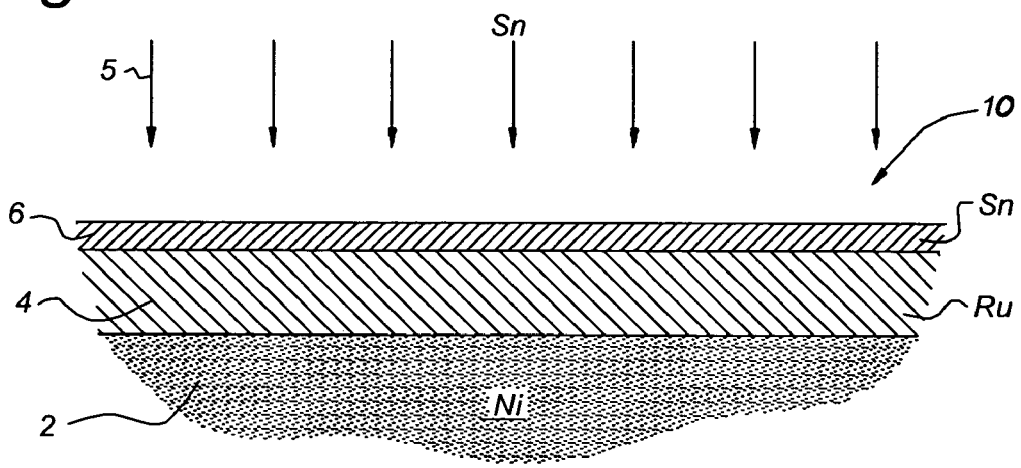
FIG. 3 depicts a portion of a mirror that may be used in a radiation collector in the system according to FIG. 2.

Referring to FIGS. 3 and 4, the present invention will now be illustrated with reference to a radiation source SO based on a discharge plasma in a Sn vapor. However, it is to be understood that the present invention may also work for other metal vapors.

FIG. 3 shows a portion of a mirror 10 that can be used in the apparatus of FIGS. 1 and 2. The mirror shown in FIG. 3 may be used as one of the mirrors in the radiation collector 50. Such a mirror may be made as a multi-layer mirror having a top layer 4 on a layer 2. There may be provided more layers below layer 2. The layer 2 may be made of Ni, whereas the top layer 4 may be made of Ru.

The radiation source SO may use Sn in order to produce extreme ultraviolet (EUV) radiation. This may be done by using tin (Sn) vapor. Part of this Sn will leak from the source chamber 47 into the collector chamber 48. Despite using the contamination trap 49, and possibly other devices and methods of reducing the Sn that escapes from the source chamber 47, part of this Sn may reach the mirrors of the radiation collector 50. There, Sn will be deposited on the reflecting Ru layer 4 of the radiation collector mirrors, as indicated with reference number 5. A Sn layer 6 will be thus be formed on the Ru layer 4. The Sn layer 6 on top of the Ru layer 4 reduces the transmission of the mirror 1. The collector transmission is defined as the effect of two reflections with an angle of incidence of 10° with respect to the mirroring surface. The transmission coefficient is thus equal to the square of the reflection coefficient for a single reflection. These two reflections are an approximation for the behavior of the collector. As defined in this way, the transmission of such a radiation collector 50 with pure Ru for EUV is 77%. However, if the Sn layer 6 is 10 nm or more, this transmission of the radiation collector 50 for EUV reduces to 21%.

In accordance with an embodiment of the present invention, the influence of Sn on the reflectance of the top layer 4 of the mirror 10 is reduced by increasing interdiffusion of Sn and a predetermined optical material for the top layer 4 of the mirror 10.

The reflectance of an optical coating on a mirror for EUV radiation is determined by the composing elements only, and chemical effects can be neglected (Spiller, *Soft x-ray optics*, SPIE Press, Washington, 1994. p. 7). The optical constants of mixtures are equal to the sum of the optical constants of composing elements of the mixture, weighted with their atom density. Therefore, it is desirable to have as many "good reflecting" atoms, and as few Sn atoms, near the reflecting surface of the mirror 10 as possible. In order to reduce the influence of Sn on the reflectance of the mirror 10, it is desirable to have an optical coating as a top layer 4 on the mirror 10 that may mix with Sn, thus, creating a mixture with enough reflecting material at the mirror surface to have a reasonable reflectance.

"Good reflecting" atoms for EUV, e.g., 13.5 nm, radiation are Mo, Nb, Ru, Zr, Rh, Pd, Au, and others. Intermixing of these atoms with Sn depends on the temperature. This provides one parameter to control. Another parameter is the material of which the optical coating layer is made. It is known that diffusion of group Ib elements, including Au, Ag, and Cu, into group IIIb and into group IVb host metals, such as Al, C, Si, Sn, can be very rapid (Nakahara, et al., *Thin Solid Films* 84 (1981), pp. 185-196; note, that for the groups nomenclature, the *European Group Labelling Scheme* is used). Moreover, the interdiffusion and phase formation in Au/Sn thin films has been studied extensively (Hugsted, et al., *Thin Solid Films* 98 (1982), pp. 81-94). It is known that their interdiffusion is very high, even at room temperature. Therefore, a gold coating as an EUV reflector on mirror 1 in a Sn depositing environment is desirable. Near the melting temperature of an alloy of Au and Sn, interdiffusion is very high. The melting point of a standard solder including 80% Au and 20% Sn is 554 K (281° C.), i.e., very low. However, for other combinations with Sn other melting points will be found, e.g., in the range between room temperature and 2800 K. For an alloy of Au and Sn, the temperature range of melting points is between room temperature and 1337 K.

Figure 4A:
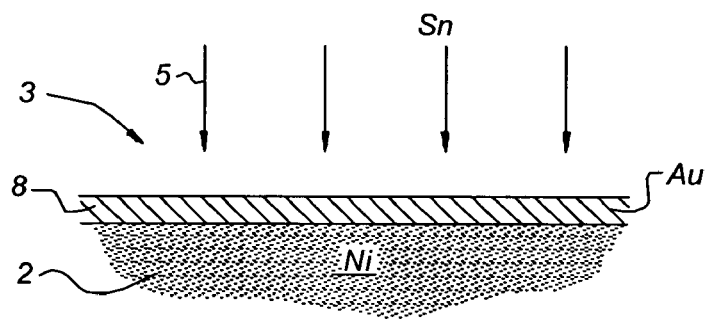
FIGS. 4a-4c depict portions of a mirror according to an embodiment of the present invention.

Referring to FIG. 4*a*, another embodiment of the present invention provides a mirror 3 with a top layer or coating 8 made of Au. This Au top coating 8 may be on top of Ni layer 2.

Figure 4B:
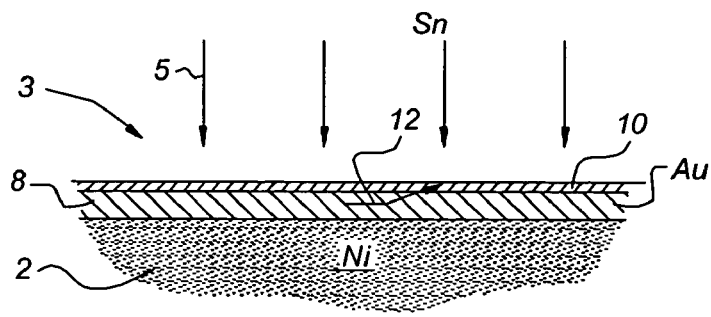
Figure 4C:
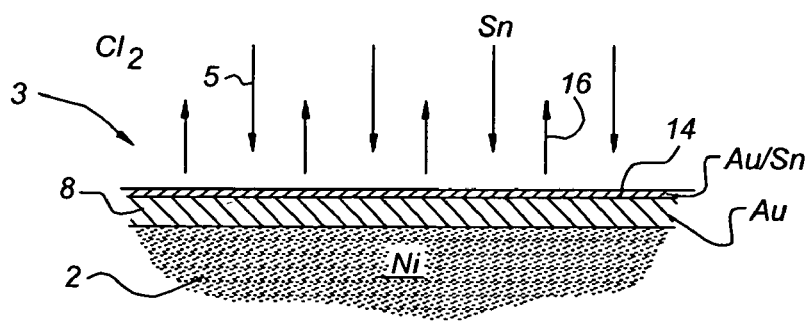

Referring to FIG. 4*b*, Sn is deposited, as indicated with reference numeral 5, on Au top coating 8. During the process of deposition of Sn atoms on the Au top coating 8, a thin layer 10 of Sn will be formed, as shown in FIG. 4*b*. Au atoms of Au top coating 8 will diffuse into this layer of Sn, as is indicated with arrow 12. Thus a layer 14 of Au/Sn will be formed on top of the Au top coating 8, as shown in FIG. 4*c*. Since the mirror 3 will be heated by the EUV radiation (not shown in FIG. 4*b*) incident on the mirror 3, the interdiffusion rate will increase with respect to room temperature operation.

This alloy film 14 can be used as reflector layer on the mirror 3. Such a mirror 3 may be used in the radiation collector 50. The collector transmission of the mirror 3 with Au/Sn alloy film 14 is approximately 0.40. This is significantly higher than the transmission of 0.21 of a mirror with a Sn layer 6 only.

Figure 4D:
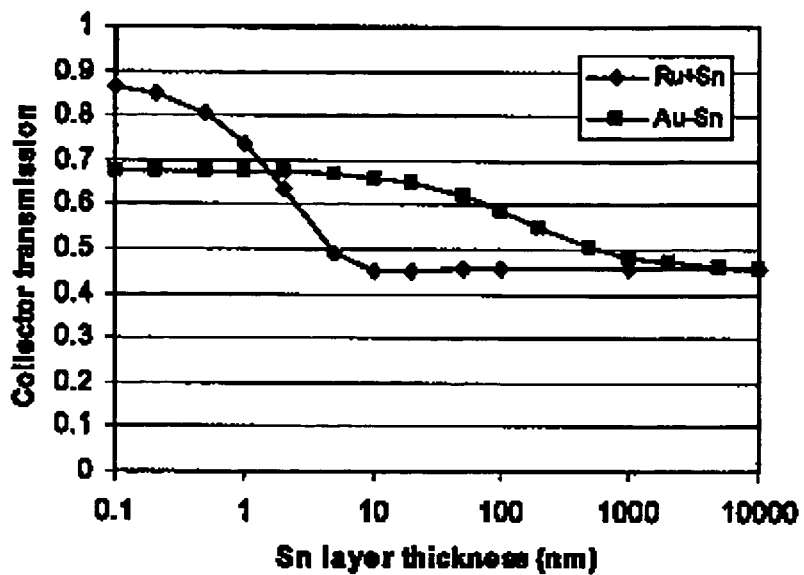
FIG. 4d is a graph showing mirror transmission of EUV as a function of a deposited Sn layer thickness.

A problem associated with using Au may be that the initial transmission, i.e. transmission before any Sn is deposited on the mirror surface, is only 0.46, compared to 0.77 for pure Ru. However, the transmission of the mirror 3 is kept significantly higher than 0.21 for pure Sn for a much longer period. This is shown in FIG. 4*d*. FIG. 4*d* shows the calculated transmission of a mirror as a function of deposited Sn layer thickness. FIG. 4*d* shows two situations. In the first situation Sn is deposited on a Ru layer 4 (FIG. 3). In the second situation, Sn is deposited on Au top coating 8 (FIGS. 4*a*-4*c*). For the Au/Sn alloy (FIG. 4*c*), it is assumed that the Au/Sn alloy layer 14 is a homogeneous mixture of 100 nm Au and the Sn layer. It is observed that the Sn layer thickness is shown on a logarithmic scale.

Since the Sn deposition is a continuous process, the Au/Sn top coating or layer 14 will, in operation, be covered with Sn. Care has to be taken that the deposited Sn will not result in an alloy which is too Sn rich, and that the deposited Sn is mixed with the Au, instead of remaining on top of the Au/Sn alloy layer 14. Depending on the thickness of the Au/Sn alloy layer 14, the mirror 3 can handle a certain amount of Sn to be deposited. This translates into the fact that the thickness of the Au/Sn alloy layer 14 where the transmission of the mirror 3 starts decreasing, which is about 20 nm in FIG. 4*d*, depends on the initial thickness of the Au layer 8. Increasing this initial thickness of the Au layer 8 results in more Sn absorption capacity. The Au layer may typically be in the range between 10 nm-10 μm.

The continuous deposition of Sn necessitates the removal of Sn from the Au layer 8. One way to do that is by "baking out", i.e., increasing the temperature of the Au/Sn alloy layer 14 in order to stimulate evaporation of Sn as a Sn vapor 16 (FIG. 4*c*). An arrangement for heating the mirror 3 will be discussed hereinafter with reference to FIG. 8.

A problem associated with the use of the Au/Sn alloy layer 14 is that the Sn vapor pressure for the Au/Sn alloy is lower than for pure Sn. Thus, removing the Sn from the Au/Sn alloy layer 14 requires a higher temperature than is needed to remove pure Sn from a surface. The fact that evaporation from the mirror surface results in slightly decreased Sn concentration at the upper surface of the Au/Sn alloy layer 14 will result in a higher reflectance since, then, a higher percentage of Au atoms will be present near this upper surface. This is desirable with respect to non-interdiffusion combinations. In order to get more Sn into the vapor phase, it is also possible to add a halogen gas, for example $Cl_2$, $Br_2$ or $I_2$. The vapor pressure of metal-halides is usually higher than the vapor pressure for pure metals. Adding a halogen gas enhances the evaporation process.

Depending on the amount of Sn that is deposited on the mirror 3, a choice can be made between different reflecting materials. Applicants have calculated the effect of interdiffusion for two cases: (1) no interdiffusion combined with a high initial reflection (e.g., Ru); and (2) very high interdiffusion combined with a low initial reflection (e.g., Au). For very low Sn doses, a Ru mirror is desirable. However, the reflection of a Ru coated mirror drops quite dramatically for very thin Sn layers, as was explained with reference to FIG. 4*d*. On the other hand, an Au coated mirror can maintain its initial transmission for a much longer period, as was explained with reference to FIG. 4*d*. Other materials are expected to perform intermediately. For example, Pd has a higher initial reflection than Au, however, Pd performs worse in interdiffusion.

It is observed that the method as described with reference to FIGS. 4*a*-4*d* does not only work for Sn vapors but also for other metal vapors, be it that interdiffusion will be higher for elements with a lower melting point. Note, that Sn has a very low melting point of 504.8 K (231.8° C.) (see also, Marinkovic, et al., *Thin Solid Films,* 217(1992), pp. 26-30).

In accordance with another embodiment, the present invention reduces the influence of Sn on the reflectance of the mirror in two ways: Firstly, keeping one or more parts of the reflecting mirror surface free from deposited Sn, such that incident EUV radiation on those parts is directly incident on Ru (or another good EUV reflector), and secondly removing the Sn from the surface.

Figure 5A:
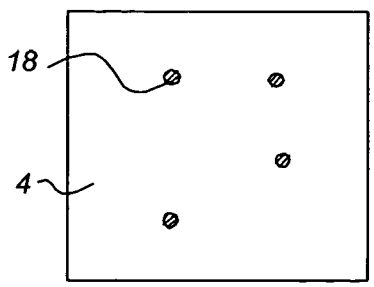
FIGS. 5a-5d depict different stages of thin film growth on the mirror surface according to another embodiment of the present invention.
Figure 5B:
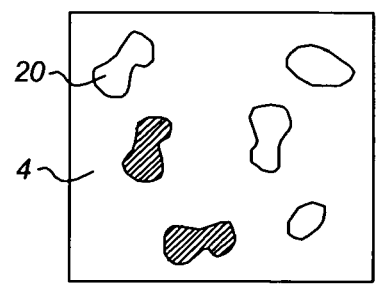
Figure 5C:
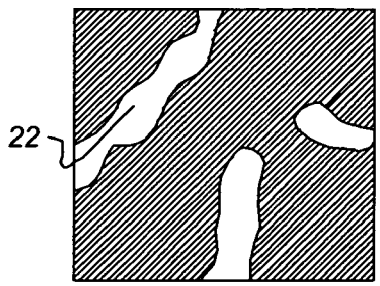
Figure 5D:
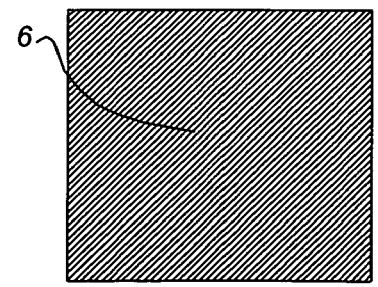

First of all, an explanation as to how thin films grow on a surface will be given with reference to FIGS. 5*a*-5*d* that show top views of a mirror on which a thin film grows. Usually, thin films grow on a surface in the following stages:

1. Nucleation stage, where small nuclei are formed. See FIG. 5*a*, where these small nuclei 18 of Sn are shown on Ru layer 4. These nuclei 18 grow until they start touching each other, which occurs at a density, which is generally referred to as the saturation density. The nucleation can be defect-induced or random.
2. Coalescence stage, where touching nuclei transform into larger nuclei 20, as shown in FIG. 5*b*, reducing the surface free energy. The larger nuclei 20 keep growing. Surface diffusion is the main transport mechanism.
3. Channel stage, where the individual larger nuclei 20 grow faster than during the coalescence process, creating more continuous channels 22 with voids and grain boundaries, as shown in FIG. 5*c*.
4. Continuous film stage, where the full area is covered with a continuous film 6, as shown in FIG. 5*d* (which is a top view of FIG. 3), which film includes grains connected by grain boundaries.

It is proposed to keep the thin film growth as long as possible in the nucleation stage, having a saturation density as high as possible. This can, for example, be accomplished in the following ways.

Figure 6:
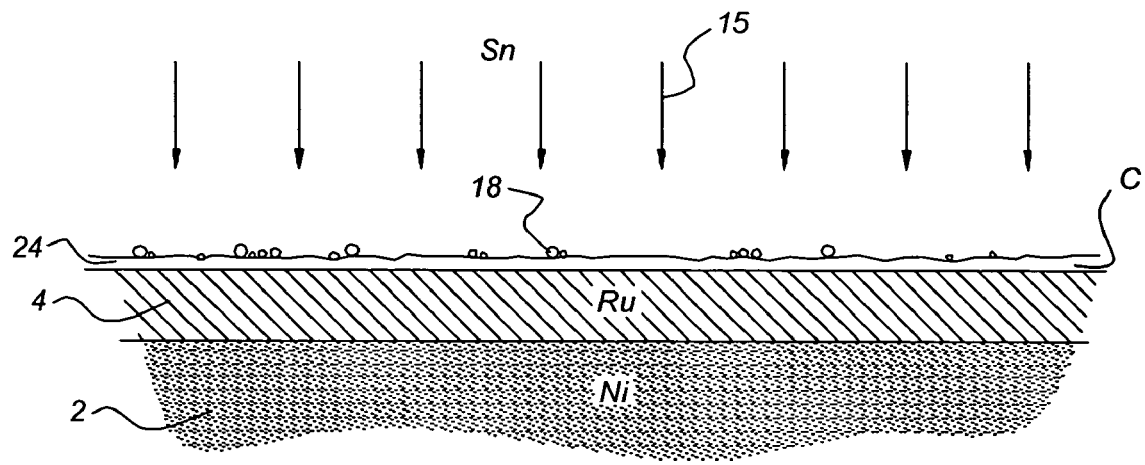
FIG. 6 depicts an embodiment of a mirror of the present invention.

In one embodiment, the surface mobility of Sn on the mirror surface is increased by applying a protective coating 24 of, for example, carbon (C) on top of the Ru (or other) layer 4, as shown in FIG. 6. This protective coating 24 can also be used for the reduction of chemical reactions of Ru (or other) layer 4 with Sn. Hence it prevents a Sn continuous film to be formed and helps keep a large part of the Ru (or other) layer 4 clean. Preferably, the protective coating 24 is selected from a material that is not easily wetted by Sn.

Figure 7:
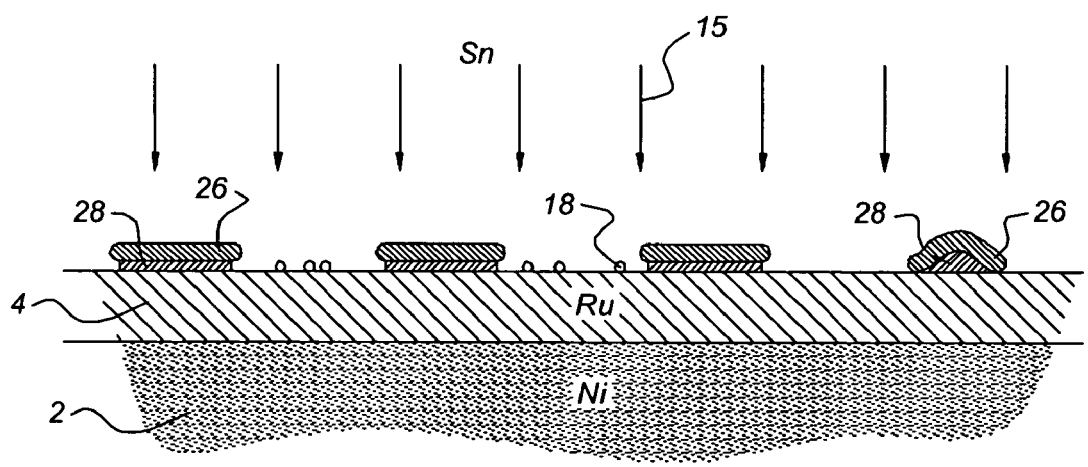
FIG. 7 depicts another embodiment of a mirror of the present invention.

In another embodiment, growth (nucleation) sites are created artificially. The deposited Sn will gather on these nucleation sites during the nucleation stage. As shown in FIG. 7, this can, for example, be done by depositing growth sites 28 of a predetermined material in the form of 'dots' on the Ru (or other) layer 4 in any desired density pattern that is suitable for illumination by EUV. Other possible nucleation sites are holes, trenches, lines, and other shapes. The growth sites 28 are preferably made of a material that is easily wetted by Sn, for example copper (Cu). The growth sites 28 may be largely flat, line shaped or dot shaped. The deposited Sn then forms similarly shaped deposition sites 26 on top of the growth sites 28.

In a further embodiment, the temperature of the Ru layer 4 is increased to increase the surface mobility of Sn on the Ru layer 4. This will keep possible nucleation sites for the Sn incident on the mirror a larger distance apart. The Sn will be gathered at the nucleation sites, keeping a large part of the Ru layer 4 clean. Thereby, the overall transmission of the mirror remains on a higher level. This may be done with the arrangement shown in FIG. 8.

Figure 8:
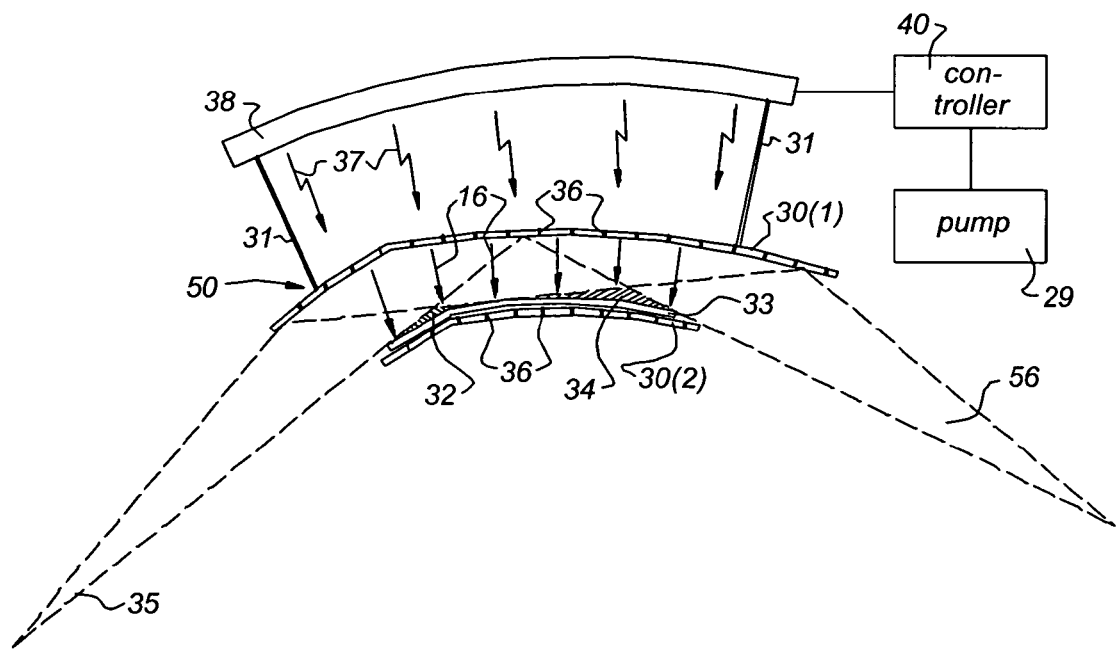
FIG. 8 depicts part of a radiation collector according to the present invention.

FIG. 8 schematically shows a heat source 38 controlled by a controller 40. The heat source 38 may be connected to a mirror 30(1) by connectors 31. The connectors 31 may be heat conductive. The controller 40 may be implemented as a suitably programmed computer, or a controller with suitable analog and/or digital circuits. The heat source 38 generates heat, indicated with arrows 37, which is directed to a first mirror of 30(1) of radiation collector 50. The radiation collector 50 is shown to include a second mirror 30(2). It should be appreciated that the radiation collector may include more than two mirrors to collect EUV radiation 35 and to produce beam 56.

Behind mirror 30(2), a cold unit 33 is provided, arranged opposite to the front surface of mirror 30(1), i.e., the surface of mirror 30(1) receiving EUV radiation 35. The cold unit 33 is termed "cold" since it is arranged outside the EUV radiation 35, i.e., in the shadow of mirror 30(2), and can, therefore, not be heated by EUV radiation 35. Dotted lines indicate how EUV radiation 35 is directed towards and reflected by mirror 30(1). These dotted lines also show that the cold unit 33 does not even receive EUV radiation reflected by mirror 30(1). Areas adjacent to cold unit 33 indicated with reference numerals 32, 34 are, thus, dark areas where no EUV radiation is present. Cold unit 33 may be attached to mirror 30(2), although it is preferred that no heat transfer from mirror 30(2) towards cold unit 33 occurs. Reference numerals 36 in mirrors 30(1) and 30(2) indicate possible through-holes.

In an alternative embodiment, mirror 30(1) could be actively cooled, e.g., by a Peltier element connected to the rear surface of mirror 30(2). This Peltier element should have a cool surface towards mirror 30(1) and a heat removal side towards mirror 30(2), to cool mirror 30(1) and heat mirror 30(2).

In operation, the heat produced by the heat source 38, heats Sn after being deposited on mirror 30(1), thus, stimulating evaporation 16 of Sn from the surface of mirror 30(1). The evaporated Sn is largely directed towards the cold unit 33 on which surface the evaporated Sn will condensate. After some predetermined operation time, the cold unit 33 may be replaced by a clean one. The cold unit 33 may be cleaned in-situ or ex-situ. The mirror 30(1) is additionally cooled by the evaporation of the Sn. Of course, the other mirror 30(2) may be heated in a similar way and may face an other cold unit. Evaporated Sn may be pumped away by a pump 29 that is connected to and controlled by controller 40.

The through-holes 36 are designed such that they have a capillary action for the Sn on the mirror surface, i.e., they collect Sn and transport it away to the rear mirror surface not receiving EUV radiation. To that effect, they may be provided with a wetting coating, e.g., made of Ag or Cu, to improve wetting by Sn, i.e. to arrange the surface in such a way that Sn, in the case it makes contact with the coating, spreads out over the entire surface of the coating. At the rear surface Sn sinks (not shown) may be provided.

Figure 9:
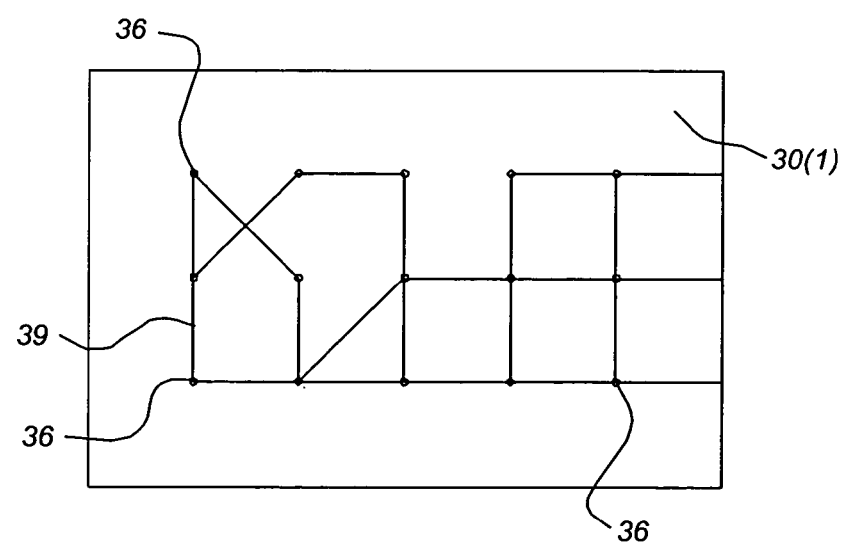
FIG. 9 depicts a front surface of a mirror according to the present invention.

Alternatively, or in addition, capillary trenches 39, possibly provided with a wetting coating, may be provided either on the front surface or on the rear surface or both, as shown in FIG. 9. These capillary trenches 39 collect Sn and transport Sn away, e.g., to the edge of the mirror where it may be collected by a Sn sink (not shown). The capillary trenches 39 may be connected to the through-holes 36 (if applied) such that Sn collected at the front side is transported to the rear side through the through-holes and from there transported to Sn sinks.

It is observed that the set-up of FIG. 8 can be applied with or without the mirrors as shown in FIGS. 3-7.

Referring again to FIG. 8, (as in the other embodiments), halides may be introduced in the system in order to have more Sn containing vapor.

While specific embodiments of the present invention have been described above, it will be appreciated that the present invention may be practiced otherwise than as described. The description is not intended to limit the invention.

What is claimed is:

1. A mirror for use in a lithographic apparatus including a radiation source to generate radiation of a desired wavelength and that, in operation, generates a stream of undesired Sn particles to form a Sn deposition on the mirror, the mirror being at least partly covered with a top layer of a predetermined metal to reduce the formation of the Sn deposition on the mirror by the stream of undesired Sn particles, generated by the radiation source in operation, the predetermined metal being selected such that it interdiffuses in a predetermined temperature range with the Sn deposition, when the lithographic apparatus is in operation, wherein the top layer has a thickness between 10 nm and 10 µm.

2. A mirror according to claim 1, wherein the predetermined temperature range is 300-2800 K.

3. A mirror according to claim 1, wherein the predetermined metal is a group Ib element.

4. A mirror according to claim 1, wherein the predetermined metal is Au or Pd.

5. A mirror for use in a lithographic apparatus including a radiation source to generate radiation of a desired wavelength and that, in operation, generates a stream of undesired metal particles to form a metal deposition on the mirror, the mirror being at least partly covered with a top layer of one or more predetermined materials, the predetermined materials being selected such that wetting of the metal deposition is enhanced only on predetermined areas of the top layer.

6. A mirror according to claim 5, wherein the one or more predetermined materials comprises a wetting material and is arranged in a pattern of at least one of dots and lines.

7. A mirror according to claim 6, wherein the wetting material is Ag or Cu.

8. A mirror for use in a lithographic apparatus including a radiation source to generate radiation of a desired wavelength and that, in operation, generates a stream of undesired metal particles to form a metal deposition on the mirror, the mirror having a structure to gather and remove the metal particles by capillary action when they are deposited on the mirror when the lithographic apparatus is in operation.

9. A mirror according to claim 8, wherein the structure comprises at least. one of capillary trenches and through holes in the mirror.

10. A mirror according to claim 9, wherein the at least one of capillary trenches and through holes are coated with a wetting material.

11. A lithographic apparatus, comprising:
a radiation source configured to provide radiation of a desired wavelength and that, in operation, generates a stream of undesired Sn particles;
an illumination system configured to condition a beam of radiation;
a support configured to support a patterning device, the patterning device configured to impart the beam of radiation with a pattern in its cross-section;
a substrate table configured to hold a substrate;
a projection system configured to project the patterned beam onto a target portion of the substrate; and
a mirror at least partly covered with a top layer of a predetermined metal to reduce the formation of a Sn deposition on the mirror by the stream of undesired Sn particles, the predetermined metal being selected such that it interdiffuses in a predetermined temperature range with the Sn deposition, when the lithographic apparatus is in operation, wherein the top layer has a thickness between 10 nm and 10 µm.

12. A lithographic apparatus according to claim 11, wherein the desired wavelength is in the EUV range.

13. A lithographic apparatus according to claim 11, wherein the mirror is part of a radiation collector.

14. A lithographic apparatus according to claim 11, further comprising a contamination trap.

15. A lithographic apparatus according to claim 11, further comprising a heat source configured to heat the mirror and increase surface mobility of the undesired Sn particles on the mirror.

16. A lithographic apparatus according to claim 11, wherein a predetermined halogen gas is provided to the surface of the mirror.

17. A device manufacturing method, comprising:
providing a beam of radiation;
patterning the beam of radiation in its cross section;
projecting the beam of radiation, after it has been patterned, onto a target portion of a substrate;
reflecting the beam of radiation using a mirror at least partly covered with a top layer of a predetermined metal to reduce a formation of a metal deposition on the mirror by a stream of undesired Sn particles, generated by a source in operation, the predetermined metal being selected such that it interdiffuses in a predetermined temperature range with the metal deposition, wherein the top layer has a thickness between 10 nm and 10 µm.

18. A device manufactured according to the method of claim 17.

19. A lithographic apparatus, comprising:
a radiation source configured to generate radiation of a desired wavelength and that, in operation, generates a stream of undesired Sn particles;
an illumination system configured to condition a beam of radiation from the radiation generated by the source, the illumination system comprising a mirror configured to receive at least some of the undesired Sn particles when the lithographic apparatus is in operation, wherein the mirror is at least partly covered with a top layer of one or more predetermined materials, the predetermined materials being selected such that wetting of the Sn deposition is enhanced only on predetermined areas of the top layer;
a heat source configured to heat the mirror and increase surface mobility of the Sn particles on the mirror;
a support configured to support a patterning device, the patterning device configured to impart the beam of radiation with a pattern in its cross-section;
a substrate table configured to hold a substrate;
a projection system configured to project the patterned beam onto a target portion of a substrate.

20. A lithographic apparatus according to claim 19, wherein the mirror has a structure to gather and remove the Sn particles by capillary action when they are deposited on the mirror when the lithographic apparatus is in operation.

21. A lithographic apparatus according to claim 20, wherein the structure comprises at least one of capillary trenches and through holes in the mirror.

22. A lithographic apparatus according to claim 21, wherein the at least one of capillary trenches and through holes are coated with a wetting material.

23. A lithographic apparatus according to claim 19, further comprising a pump configured to pump away undesired metal vapor evaporated from the mirror.

24. A lithographic apparatus according to claim 19, further comprising a plurality of mirrors configured as a radiation collector, the plurality of mirrors being configured to receive at least some of the undesired Sn particles when the lithographic apparatus is in operation, wherein at least one mirror of the radiation collector comprises a rear surface facing a front surface of another mirror of the radiation collector, the rear surface of the at least one mirror being configured to receive metal particles evaporated from the front surface of the another mirror and to operate as a condensation surface.

25. A lithographic apparatus according to claim 19, wherein a predetermined halogen gas is provided to the surface of the mirror.

26. A method for reducing the formation of a metal deposition on a mirror for use in a lithographic apparatus comprising a source to provide radiation of a desired wavelength, the metal deposition being caused by a stream of undesired Sn particles, generated by said source in operation, the method comprising:
forming a metal top layer having a thickness between 10 nm and 10 µm on the mirror;
heating the mirror to a predetermined temperature range with a heat source; and
forming the metal deposition into an alloy layer by interdiffusion of the metal top layer with the metal deposition, when said lithographic apparatus is in operation.

27. A method according to claim 26, wherein said predetermined temperature range is 300-2800 K.

28. A method according to claim 26, wherein said metal top layer is formed from at least one of group Ib elements.

29. A method according to claim 28, wherein the metal top layer is formed from Au.

30. A method according to claim 26, wherein the metal top layer is formed from Pd.

* * * * *